(12) United States Patent
Xiao et al.

(10) Patent No.: US 10,402,709 B2
(45) Date of Patent: Sep. 3, 2019

(54) ALL-DIGITAL SENSING DEVICE AND IMPLEMENTATION METHOD

(71) Applicant: Clemson University, Clemson, SC (US)

(72) Inventors: Hai Xiao, Clemson, SC (US); Wenge Zhu, Central, SC (US)

(73) Assignee: Clemson University, Clemson, SC (US)

( * ) Notice: Subject to any disclaimer, the term of this patent is extended or adjusted under 35 U.S.C. 154(b) by 0 days.

(21) Appl. No.: 15/710,394

(22) Filed: Sep. 20, 2017

(65) Prior Publication Data

US 2019/0087701 A1    Mar. 21, 2019

(51) Int. Cl.
*G06K 19/07* (2006.01)
*G06K 7/10* (2006.01)
*H01L 41/113* (2006.01)

(52) U.S. Cl.
CPC ..... *G06K 19/0717* (2013.01); *G06K 7/10366* (2013.01); *G06K 19/0723* (2013.01); *H01L 41/1132* (2013.01)

(58) Field of Classification Search
CPC ............... G06K 19/0717; G06K 7/10366
USPC ........................................ 235/451
See application file for complete search history.

(56) References Cited

U.S. PATENT DOCUMENTS

| 8,068,010 B2 | 11/2011 | Bauchot et al. |
| 8,556,184 B2 | 5/2013 | Perret et al. |
| 2007/0205916 A1* | 9/2007 | Blom ............... G01K 7/01 340/870.17 |
| 2009/0066641 A1* | 3/2009 | Mahajan ............ A63F 13/10 345/156 |

* cited by examiner

*Primary Examiner* — Toan C Ly
(74) *Attorney, Agent, or Firm* — Dority & Manning, PA

(57) ABSTRACT

Devices, systems, and methods provide direct digitization and encoding of a parameter to be sensed or measured. Digitized readings are encoded into binary bits, which are acquired and handled by digital devices. An all-digital sensing device can be implemented in passive, active, or semi-passive forms, and in some embodiments includes a transducer, digitizer/encoder, reader, and transmitter. A transducer converts the parameter to be measured into a digitizable quantity, based on such as mechanical deformation, dielectric properties, or electromagnetic wave or acoustic-wave properties. A piezoelectric material transducer converts stress/pressure into resistance or voltage. A fiber-optic interferometer transducer converts pressure/temperature/PH into irradiation amplitude or wavelength shift in spectrum domain. Encoded binary or quasi-binary states are identified by a reader. Binary states have resolutions arranged according to a $2^N$ format. Each binary state can be presented in mechanical, electromagnetic, optical, or acoustic forms, or in step or continuous form.

34 Claims, 14 Drawing Sheets

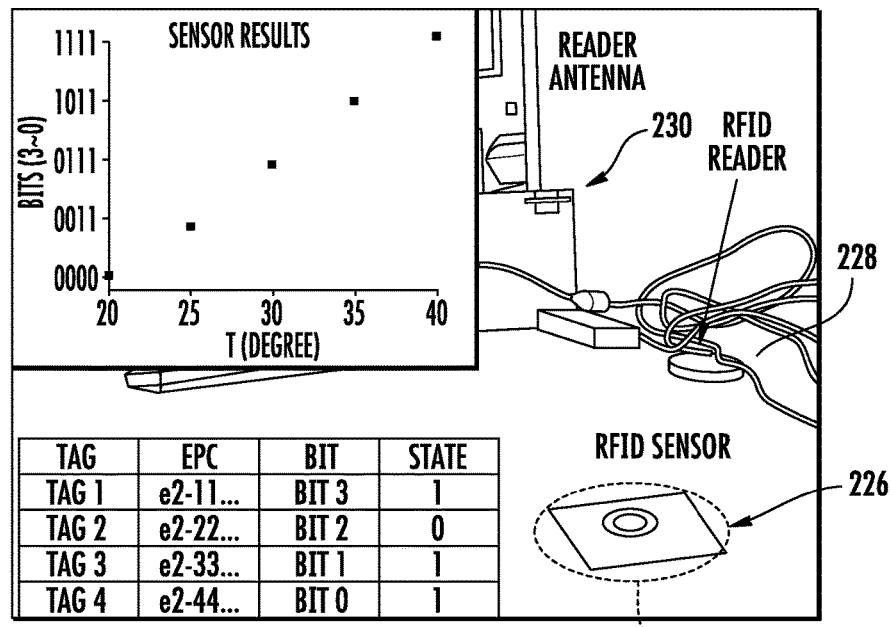
FIG. 17A
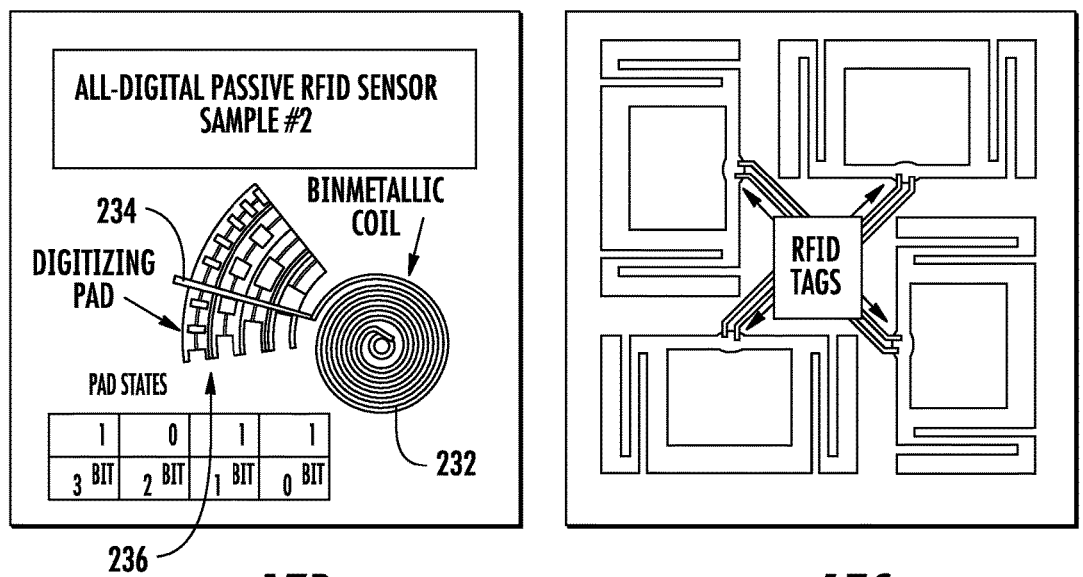
FIG. 17B
FIG. 17C

ALL-DIGITAL SENSING DEVICE AND IMPLEMENTATION METHOD

GOVERNMENT SUPPORT CLAUSE

This present disclosure was made without any government support

FIELD

The present disclosure relates generally to direct digitizing and encoding of a parameter to be sensed or measured. More particularly, the present subject matter relates to devices, systems, and methods which provide digitized readings encoded into binary bits, to be acquired and handled by digital devices.

BACKGROUND

In the marketplace of sensors generally, there is a growing demand for smart sensors, such as in the consumer electronics industry, automotive industry, healthcare industry, and in some industrial sectors such as textile, material manufacturing, and Food and beverage (F&B) among others. Generally speaking, sensors are preferred to be small in size, light in weight, non-intrusive, and to have low power consumption.

Wireless sensors operating with a sensor network are often desirable to monitor various parameters. Eliminating cable requirements makes such sensors easy for installation and deployment. For example, temperature and humidity sensors are widely used to monitor and optimize the operation of heating, ventilation and air conditioning (HVAC) in the building automation industry. Accelerometers are commonly utilized for health monitoring in consumer electronics industry. While commercially available wireless sensors exist today, the costs of current platforms are still high (for example, possibly about $25-$250/node), and the service lifetimes of required batteries are still relatively short. A main cost contributor to such sensor nodes are their on-board battery components. In addition to time consumption, maintenance such as battery replacement involves much labor cost. Thus, better wireless sensors with relatively lower costs (for example, under $10/node), providing multi-functions, and requiring less maintenance, are highly desired.

Sensors operable in relatively harsh environments are important in certain circumstances, such as in aerospace and downhole applications, where for example high temperature and high pressure environments may degenerate operations or even disable such sensors. For example, temperatures outside satellites or space vehicles can go below 3 degrees Kelvin, in which case conventional electrical devices can't survive.

Typically, a transducer can work under hard conditions, while a signal conditioner and processor works at normal conditions. Therefore, an unconditioned signal is too weak to be transmitted out of a harsh zone and still achieve less distortion and loss. Improved sensor technology is desired for better addressing such technical problems.

For harsh environment sensors, transducers may be typically be provided in the sensing environment, while the ADCs (analog to digital converters) and digital processors may be isolated from the sensing environment, as referenced herein. As such, the analog signal path from the transducer to the ADC could be affected by noise in the harsh operating environment, leading to an undesirably low signal to noise ratio (SNR).

Generally speaking, chipless radio-frequency identification (RFID) tags are RFID tags that do not require a microchip in a transponder. Such tags contain electronically stored information, which is detected by being read through the use of electromagnetic fields. For example, such a device backscatters the signal from the reader without a protocol control system. One benefit is that a powerless feature is achieved, which can be utilized to fabricate relatively low-cost passive sensors. One example of a chipless RFID tag and method for communicating with the RFID tag is represented by U.S. Pat. No. 8,068,010. Another example of a chipless passive RFID tag is represented by U.S. Pat. No. 8,556,184. The complete disclosures of such patent documents are incorporated by reference herewith, and for all purposes.

Chipless RIM may be generally classified into time-domain reflectometry and frequency signature techniques. In time domain reflectometry, the interrogator or reader sends a pulse and listens for echoes. The timing of arrival pulses encodes the binary data. Among the time domain reflectometry, surface acoustic wave based RFID tag is sometimes of interest for some applications because it has relatively low loss. In frequency signature RFIDs, the interrogator sends waves with several frequencies, a broadband pulse or a chirp, and detects the echoes' frequency content. The presence or absence of certain frequency components in the received waves encodes the data. With the same method, it is possible to inscribe the transducer signal on a time or frequency domain.

In other circumstances, the need for relatively high sensor sensitivity can require a signal detection instrument associated with the sensor (e.g. vector network analyzer) to have a large dynamic range (DR). For instance, a network analyzer may need to operate at a DR better than 120 dB. Such a relatively large dynamic range can cause environmental interference, such as mechanical vibrations and/or scattered RF radiations, which can destabilize, for example, interferometer operations. Therefore, in such example, a need exists for a simple, robust RF sensor that can simultaneously provide both increased sensitivity and lower system DR requirements.

SUMMARY

Aspects and advantages of embodiments of the present disclosure will be set forth in part in the following description, or may be learned from the description, or may be learned through practice of the embodiments.

In general, it is a present object to provide improved sensor arrangements, and associated methodology. It is a more particular object, in some instances, to provide improved low cost and long life wired or wireless sensors.

It is also a present object to provide in some instances for obtaining digital data from sensors, without any signal processing needed.

It is yet another present object in some embodiments to provide for direct digital data transmission (either wired or wireless), for display and/or storage.

In still other present exemplary embodiments, it is desired to provide for effective sensing in harsh environments, for example, where electronics and/or batteries can otherwise not typically survive, such as in high temperatures.

In other broader aspects of presently disclosed subject matter, an all-digital sensing concept can be implemented as battery-free and without on-site electronics (meaning that no signal processing is needed).

Other more broad aspects of presently disclosed subject matter relate to all-digital sensing devices and corresponding and/or associated implementation methods.

Some advantages of exemplary presently disclosed subject matter embodiments include, for example, direct digital outputs via an on-board built-in digitizer, passive sensing (which allows for elimination of a battery), digital interface (for ease of connections with existing digital systems and technology), chipless implementation so that no signal processing is needed and the technology is operative in harsh environments, ability to achieve high signal to noise ratios (for effective work even in high-noise environments), and relatively low cost implementation due to mass production possibilities.

Another advantage of some exemplary embodiments of presently disclosed sensing technology is use of a relatively low-power sensing platform, which provides advantages especially in wireless sensor nodes.

Thus, broadly speaking, an all-digital sensing technique is disclosed. An exemplary embodiment of such an all-digital sensing device digitizes a parameter to be measured and encodes it into binary bits. In some exemplary embodiments, after digitization, the binary bits can be acquired, processed, transmitted, and displayed by standard digital devices/processors.

Such all-digital sensing devices as disclosed herewith may be implemented in many forms, including passive (or power-less), active (or powered), and semi-passive (or battery-assisted).

Still further, an aspect of certain presently disclosed exemplary embodiments is that the presently disclosed all-digital sensing technology allows seamless integration with digital systems by utilizing a digitizer to quantize an analog change and eliminate power needs for sensing. As a result, sensor node power consumption is reduced, making low-cost wireless sensors with long lifetime possible.

Another broader object of the presently disclosed technology is to provide improved sensors for operation in a variety of settings, including for example, consumer electronics, health care industry, industry process control (e.g., oil and gas refinery, pharmaceutical, automobile, energy and power), and for the defense industry.

One exemplary embodiment in accordance with presently disclosed subject matter relates to an apparatus for direct digitization and encoding of a parameter to be sensed or measured. Such an apparatus preferably comprises an encoder for producing encoded binary states based on a digitizable quantity from a transducer associated with a parameter to be sensed or measured; and a digitizing reader for producing binary bits from such encoded binary states from such encoder.

Per some variations of such apparatus, such encoder may include a plurality of channels for producing binary states having resolutions arranged according to a $2^N$ format. For some other variations, such binary states may comprise one of mechanical, electromagnetic, optical, acoustical, step, and continuous forms.

For other variations of such apparatus, a transmitter may be included for receiving such binary bits and transmitting them to external digital devices for processing. For some such variations, such encoder may be a passive device; and such transmitter may be one of a wired and wireless device.

Yet other alternatives of the foregoing apparatus may further include a transducer for converting a parameter to be measured into an analog digitizable quantity. For some such alternatives, such transducer conversion may be based on one of mechanical deformation, dielectric properties, permeability properties, conductivity properties, electromagnetic wave properties, and acoustic-wave properties. In some of such variations, such transducer may comprise a piezoelectric material transducer for converting stress/pressure into electrical resistance or voltage. For others thereof, such transducer may comprise a fiber-optic interferometer transducer for converting pressure/temperature/PH into one of irradiation amplitude or wavelength shift in the spectrum domain.

For other alternatives of the foregoing apparatus, such encoder may produce N-channel periodic quantities; and such digitizing reader may convert such N-channel periodic quantities from such encoder into an N-bit binary combination. For some such alternatives, such reader, for each channel of such N-channel periodic quantities, may use a reference threshold for comparison, to convert encoder quantities for each channel to one of two binary states based on whether the quantity is above or below the reference threshold. For yet other of such alternatives, such N-bit binary combination may comprise one of natural binary code, folded binary code, 1's complement coding, 2's complement coding, and gray code.

Another exemplary embodiment in accordance with the presently disclosed subject matter relates to a system for all-digital direct sensing, digitizing, and encoding of a parameter to be measured. Such system preferably comprises a transducer for converting a parameter to be measured into an analog digitizable quantity output; a passive digitizer and encoder for quantizing such transducer output and encoding such output into binary states having a $2^N$ format; and a reader for decrypting such formatted binary states into N-bit binary combinations with one-to-one mapping to the parameter to be measured.

Some variations of such a system may further comprise a transmitter for forwarding such N-bit binary combinations from such reader to other digital devices for processing thereof. For others thereof, such passive digitizer and encoder may include a periodic pattern and a plurality of markers relatively displaced from each other by such transducer output. For some such variations, such binary states may include N-channel periodic quantities; and such reader, for each channel of such N-channel periodic quantities, may use a reference threshold for comparison, to convert encoder quantities for each channel to one of two binary states based on whether the quantity is above or below the reference threshold.

For other present alternative such systems, such transducer output may be based on one of mechanical deformation, dielectric properties, permeability properties, conductivity properties, electromagnetic wave properties, and acoustic-wave properties. For others thereof, such binary states may comprise one of mechanical, electromagnetic, optical, acoustical, step, and continuous forms. For still others, such N-bit binary combinations may comprise one of natural binary code, folded binary code, 1's complement coding 2's complement coding, and gray code.

For some variations of the foregoing systems, such passive digitizer and encoder may be one of impedance-based, displacement-based, waveguide-based, and optical logic-based. For others thereof, such passive digitizer and encoder may comprise a liquid-in-glass digitizer; and such system may comprise a high temperature digital thermometer application. For still others thereof, such passive digitizer and encoder may comprise a diaphragm-based digitizer for pressure sensing.

For other variations of the foregoing systems, such transducer may comprise a bimetallic coil having a coil tip, to convert temperature into angle change of such coil tip; such passive digitizer and encoder may comprise a set of arcuate N-channel inter-digit pads directly associated with movement changes of such coil tip, for creating a corresponding N plurality of shorted or open binary states relative to such coil tip; such reader may decrypt such plurality of shorted or open binary states into such N-bit binary combinations with one-to-one mapping to the parameter to be measured; such parameter to be measured may be ambient temperature at such bimetallic coil; and such system may further include at least one REID chip for forwarding of such N-bit binary combinations.

It is to be understood that the presently disclosed subject matter equally encompasses corresponding and associated methods. One exemplary methodology relates to direct digitization and encoding of a parameter to be sensed or measured. Such exemplary methodology preferably comprises encoding directly into encoded binary states a digitizable quantity from a transducer associated with a parameter to be sensed or measured; and producing binary bits from such encoded binary states.

For some embodiments of such methodology, such encoding may include producing encoded binary states for a plurality of channels having resolutions arranged according to a $2^N$ format. For others, such encoded binary states may comprise one of mechanical, electromagnetic, optical, acoustical, step, and continuous forms.

Further, some variations of the foregoing methodology may further include transmitting such binary bits to external digital devices for processing. For others thereof, such encoding may use a passive device, not requiring external power; and such transmitting may be either wired or wireless transmission.

Other variations of such methodology may further include converting a parameter to be measured into an analog digitizable quantity. For yet others thereof, such converting may be based on one of mechanical deformation, dielectric properties, permeability properties, conductivity properties, electromagnetic wave properties, and acoustic-wave properties. For others, such converting may include providing a piezoelectric material transducer for converting stress/pressure into electrical resistance or voltage. For other alternatives, such converting may include providing a fiber-optic interferometer transducer for converting pressure/temperature/PH into one of irradiation amplitude or wavelength shift in the spectrum domain.

For other variations of the foregoing methodology, such encoding may include producing N-channel periodic quantities; and such producing binary bits may include converting such N-channel periodic quantities into an N-bit binary combination. For others thereof, such N-channel periodic quantities may be based on variations in properties of impedance, permittivity, capacitance, permeability, inductance, conductivity, or resistance, or variations in waveguide properties for electromagnetic, optical, or acoustic spectra, including properties of reflection coefficient and transmission coefficient. For still others, such converting such N-channel periodic quantities may include, for each channel of such N-channel periodic quantities, using a reference threshold for comparison, to convert encoded quantities for each channel to one of two binary states based on whether the quantity is above or below the reference threshold. For yet others, such N-bit binary combination may be formed using one of natural binary code, folded binary code, 1's complement coding, 2's complement coding, and gray code.

Per various alternatives of the foregoing methodology, such parameter to be sensed or measured may comprise temperature, strain, refractive index, pressure, vibration, distance, velocity, acceleration, current, or voltage, or intensity or frequency or wavelength of acoustic wave, electromagnetic wave, or optical wave spectra.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIGS. 17A, 17B, and 17C depict an example of an all-digital passive RFID sensor for a 4-bit wireless temperature sensor application according to example embodiments of the present disclosure.

Figure 1:
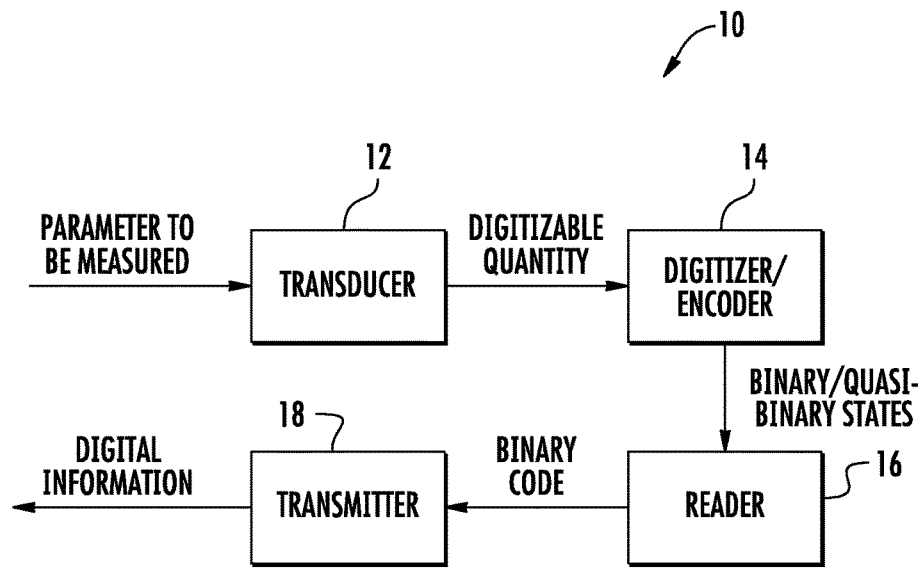
FIG. 1 depicts an example schematic block diagram of an example all-digital sensing system according to example embodiments of the present disclosure.

Repeat use of reference characters in the present specification and drawings is intended to represent the same or analogous features or elements or steps of the presently disclosed subject matter.

DETAILED DESCRIPTION

Reference now will be made in detail to embodiments, one or more examples of which are illustrated in the drawings. Each example is provided by way of explanation of the embodiments, not limitation of the present disclosure, in fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to an all-digital sensing system and associated methodology. More specifically, the all-digital sensing system digitizes a transducer's output signal into a bit combination, which can then be acquired, processed, transmitted, and displayed by standard digital devices/processors.

FIG. 1 depicts an example schematic block diagram of an example all-digital sensing system generally 10 according to example embodiments of the present disclosure. System 10 uses an all-digital sensing technique as described herein. For example, the all-digital sensing device 10 digitizes the parameter to be measured and encodes it into binary bits. After digitization, the binary bits can be acquired, processed, transmitted, and displayed by standard digital devices/processors. An all-digital sensing device as disclosed herewith may be alternatively implemented by many forms, including passive (or power-less), active (or powered), and semi-passive (or battery-assisted).

Per the exemplary embodiment represented in FIG. 1, an all-digital sensing device 10 may include a transducer 12, digitizer/encoder 14, reader 16, and transmitter 18. As shown, input from a parameter to be measured is associated with transducer 12, which results in a digitizable quantity being provided to digitizer/encoder 14. From there, binary or quasi-binary states are passed to reader 16, so that a binary code is presented to transmitter 18. Such arrangement allows transmitter 18 to forward digital information, as shown.

Figure 2:
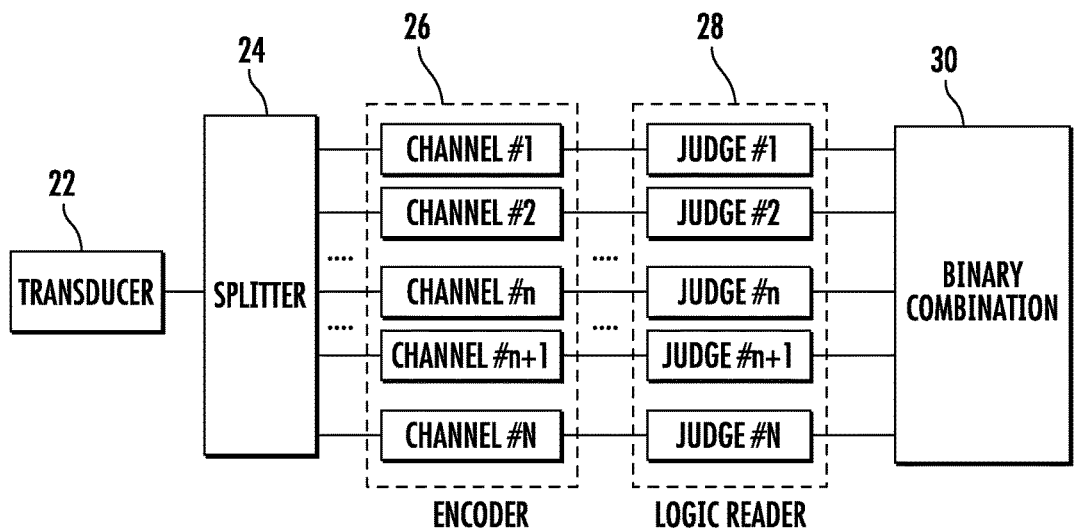
FIG. 2 depicts a more detailed example schematic block diagram of an example all-digital sensing system according to example embodiments of the present disclosure.

FIG. 2 depicts a more detailed example schematic block diagram of an example all-digital sensing system generally 20 according to example embodiments of the present disclosure. More specifically, FIG. 2 represents system 20 from a functional perspective.

Further, the exemplary all-digital sensing system 20 digitizes a transducer's output signal into an N-bit combination, which can then be acquired, processed, transmitted, and displayed by standard digital devices/processors. In some embodiments, such exemplary system 20 may include a transducer 22 associated with a splitter 24, an encoder 26, and a reader 28.

Transducer 22 converts the parameter to be measured into a measurable quantity. For example, transducer 22 may convert the parameter to be measured into a digitizable quantity, such as a displacement or a change in angle.

Per various embodiments and applications of the presently disclosed subject matter, the parameter to be measured can be various, like temperature, strain, refractive index, pressure, vibration, distance, velocity, acceleration, current, voltage, wave (acoustic, electromagnetic, optical) intensity or frequency/wavelength.

Likewise, the measurable quantity can be various, like mechanical deformation (e.g. displacement, expansion, deflection, angle turning), dielectric properties (e.g. permittivity (capacitance), permeability (inductance), conductivity (resistance)), electromagnetic wave (acoustic, electromagnetic, optical) properties (e.g. amplitude, phase, frequency/wavelength, and polarization). All such variations of parameters and measurable quantities, and others, are intended to come within the spirit and scope of the present disclosure.

Splitter 24 functionality is to distribute the input quantity (i.e., the output of transducer 22) into N channels, where the n-channel is a map of the input quantity (n=1, 2, . . . , N). The output quantities of N channels aren't necessarily the same, while the output quantity of an n-channel is a one-to-one map of its respective input quantity.

Digitizer/encoder 26 functionality is to quantize the output from the transducer into discrete levels and/or encode them into binary/quasi-binary states, whose logics can be identified by an associated reader 28. In other words, the functionality of exemplary encoder 26 is to encode into n-channel values with periodic components in response to the respective input n-channel quantities from splitter 24, which can be digitized into n-bits by the following logic reader, respectively (n=1, 2, . . . , N).

The n-channel output values with periodic spectrum can be various, like impedance properties (e.g. permittivity (capacitance), permeability (inductance), conductivity (resistance)), car waveguide (electromagnetic, optical, acoustic) properties (e.g. reflection coefficient, transmission coefficient). All such variations of n-channel output values with periodic spectrum, and others, are intended to come within the spirit and scope of the present disclosure.

Further, the n-channel output values have periodic patterns or components as a function of the input quantities in encoder 26. The periods of the periodic components in N-channel output value quantities are preferably arranged in the form of 2-times increments (e.g. $Tn=2*T_{n-1}$ or $fn=2*f_{n-1}$).

The functionality of reader 28 is to identify and read out the states from digitizer/encoder 26 and decrypt into binary code, which one-to-one map the parameter to be measured. The binary code can be natural binary code, folded binary, 1's complement, 2's complement, gray code or others, as understood by those of ordinary skill in the art without additional detailed explanation. Logic reader 28 functions to convert N-channel periodic quantities from encoder into an N-bit binary combination, which can then be transmitted or processed by other digital systems or devices.

The reading method of reader 28 in terms of detection signal can be various, like electromagnetics, optics, acoustics. All such variations of reading methodology in terms of detection signals, and others, are intended to come within the spirit and scope of the present disclosure.

In each channel judge, as represented in FIG. 2, a reference/threshold is used for conversion. If the input quantity is larger than the threshold, it denotes "1", while if the input quantity is smaller than the threshold, it denotes "0", or vice versa.

N output bits from N channels construct an N-bit binary code (see resulting binary combination 30 of FIG. 2), which one-to-one map the parameter to be measured. The coding of N-bit binary code can be various, like natural binary code, folded binary, 1's complement, 2's complement, gray code etc. All such variations are intended to come within the spirit and scope of the present disclosure.

The functionality of an associated transmitter when used (see for example FIG. 1) is to send out the binary codes 30 to distant digital devices and processors through wire or wireless media.

Figure 3:
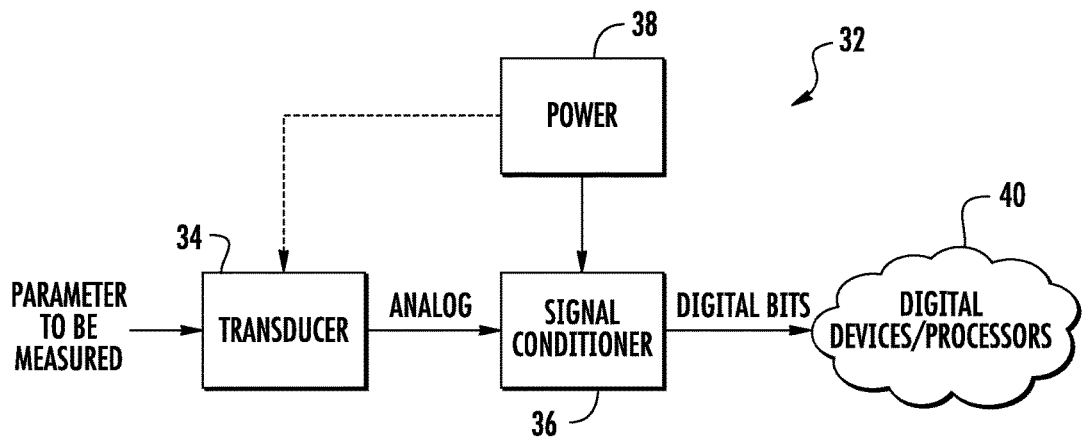
FIG. 3 depicts a schematic block diagram of a prior art system for obtaining digital representations of a parameter to be measured.

FIG. 3 depicts a schematic block diagram of a prior art system generally 32 for obtaining digital representations of a parameter to be measured. As shown in FIG. 3, an example of a typical sensing front-end may include three functions, represented by a transducer, signal conditioner/processor 36, and power supply 38. Transducer 34 converts a parameter to be measured into an analog signal (for example, in many instances, an electrical signal may be used). Such prior art transducer 34 functionality can be implemented, for example, by passive technology (e.g. thermocouple) or active technology (e.g. thermistor). Then, the resulting analog signal is conditioned and digitized into binary bits. Such signal conditioner 36 functionality is in many instances implemented using active electrical components, such as operational amplifiers and ADCs, which are implemented by integrated circuits. The power consumption of signal conditioner 36 varies with its features, like sampling speed, resolution, noise suppression, accuracy, and/or algorithm. Finally, the encoded digital bits (as output by signal conditioner 36) are acquired and/or processed by standard digital devices and processors generally 40. As will be understood, power from power 38 is required for both transducer 34 and signal conditioner 36.

Figure 4:
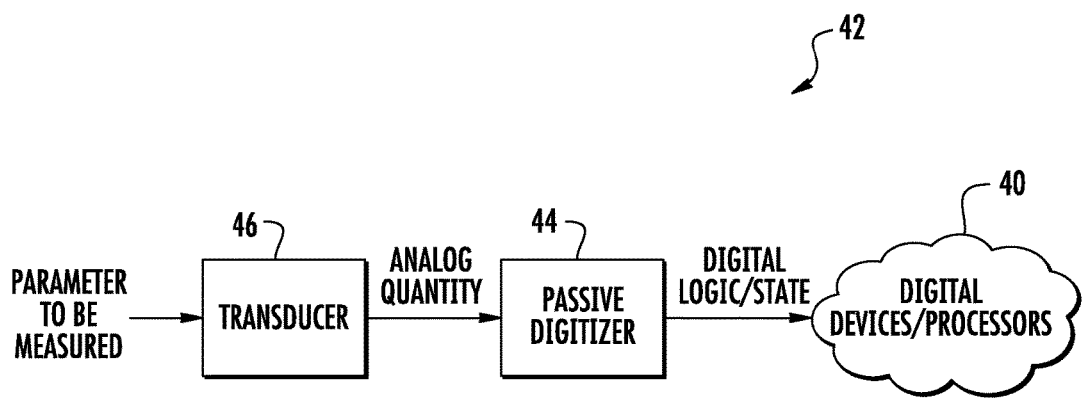
FIG. 4 depicts an example schematic block diagram of an example sensing system according to example embodiments of the present disclosure, using a passive digitizer.

FIG. 4 depicts an example schematic block diagram of an example sensing system 42 according to example embodiments of the present disclosure, using a passive digitizer 44. Use of such passive digitizer and an associated analog quantity as input from a compatible transducer 46 (interfaced with the parameter to be measured) has the advantage that no power is needed for either transducer 46 or passive digitizer 44. Therefore, encoded digital bits (as output by passive digitizer 44) are again able to be acquired and/or processed by standard digital devices and processors generally 40, but without requiring power to generate such encoded digital bits.

Figure 5:
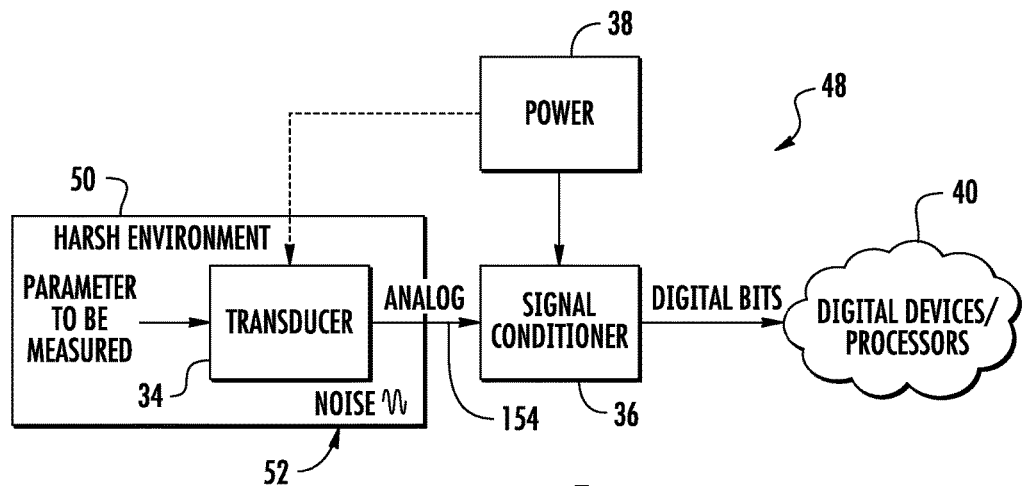
FIG. 5 depicts a schematic block diagram of a prior art system for obtaining digital representations of a parameter to be measured, in a harsh environment.

FIG. 5 depicts a schematic block diagram of a prior art system generally 48 for obtaining digital representations of a parameter to be measured, in a harsh environment generally 50. In general, FIG. 5 technology may be similar to the represented FIG. 3 technology, including a transducer 34, signal conditioner 36 and power 38 functionality involved with outputting digital bits to standard digital devices and processors generally 40.

Since the encoded digital bits are acquired and/or processed by standard digital devices and processors comprised of semiconductors, it is understood that such components typically can't survive in harsh environment 50. For example, high temperature environments can be contraindicated for use with semiconductors. While a transducer may be able to survive in harsh environment 50, as represented in FIG. 5, when an analog signal is transmitted from harsh environment 50 to a more normal environment, it may be deteriorated by ambient noise generally 52. Due to harsh environment 50 conditions, the result is that sensors usually have transducers in the sensing environment 50, while the ADCs and digital processors are isolated from the sensing environment (FIG. 5). However, as noted, the analog signal path generally 54 from transducer 34 to ADC (signal conditioner 36) would be affected by the environmental noise 52, leading to low signal to noise ratio (SNR).

Figure 6:
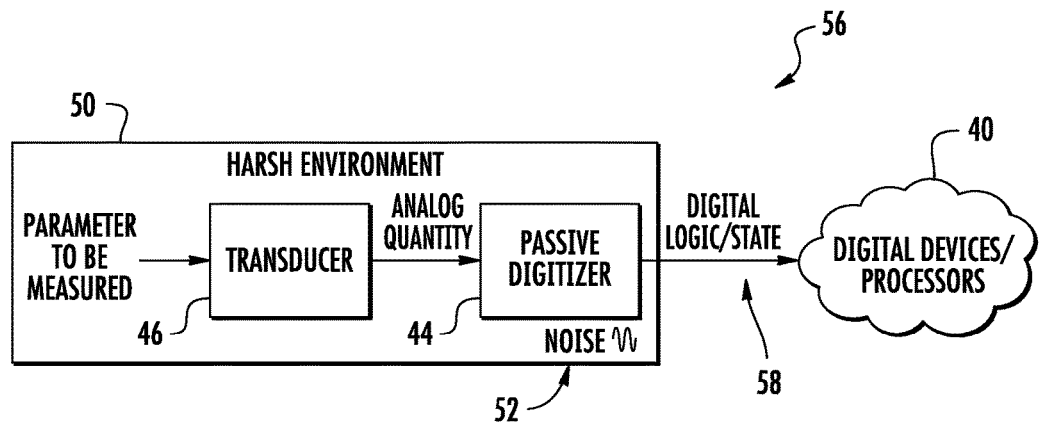
FIG. 6 depicts an example schematic block diagram of an example sensing system according to example embodiments of the present disclosure, using a passive digitizer, and operative in a harsh environment.

FIG. 6 depicts an example schematic block diagram of an example sensing system generally 56 according to example embodiments of the present disclosure, using a passive digitizer generally 44, and operative in a harsh environment 50. Because the exemplary embodiment of system 56 according to the presently disclosed subject matter makes no use of electronics for harsh environment sensing, and makes no use of a battery, it can survive in relatively higher temperature environments. Further, as understood from the complete discussion herewith, through use of transducer 46 with passive digitizer 44, and despite the presence of noise generally 52 in harsh environment 50, the all-digital sensing concept for system 56 can be implemented as battery-free and without on-site electronics (i.e., no signal processing is needed), for a harsh environment solution to sensing.

Transducers which convert to analog signals may survive in harsh environment sensors, but as noted above, the analog signal experiences interference from the environmental noise, until it arrives at the signal conditioning and ADC (even if they are isolated from the harsh environment). For such reason, an analog signal per the FIG. 5 system can be significantly distorted, and have a relatively low SNR. However, the FIG. 6 system generally 56 of the presently disclosed subject matter achieves digitization directly in a harsh environment. As such, a resulting digital signal with high noise immunity is directly transmitted to digital devices/processors generally 40.

Per the example of FIG. 6, transducer 46 converts the parameter to be measured into an analogy quantity, rather than an analog electrical signal. Then passive digitizer 44 quantizes the output of the transducer 46 and encodes into binary states following a $2^N$ format, which can be decrypted and readout by digital devices and processors 40. Thus, the parameter to be measured can simply be N bits with one-to-one mapping.

Since transducer 46 and digitizer 44 do not consume power, it is possible to eliminate the power function from the sensing front-end of FIG. 6 per the presently disclosed subject matter. In addition, the passive digitizer 44 can survive under harsh environment 50. When the digitized signal generally 58 (FIG. 6) is transmitted from harsh environment 50 to a relatively more normal environment, the digital signal 58 has higher resistance to noise 52.

Therefore, the sensing technology generally 56 of FIG. 6 establishes that: no signal processing is needed (which eliminates a need for a power supply); direct digital data transmission enables easy display, processing and storage; use of a passive sensor makes the sensor low in cost and have an extended lifetime; and the passive and all-digital sensing concept can be implemented as battery-free and without on-site electronics (no signal processing) with high SNR. For such reasons, the presently disclosed subject sensing technology has advantages of being a low-power sensing platform, especially useful for wireless sensor nodes. Furthermore, with a signal conditioner replaced by a passive digitize, the sensing front-end can survive in harsh environments, so that a digitized signal can be easily transmitted out of a harsh zone with less distortion and loss.

The functionality of representative exemplary transducer 46 is to convert the parameter to be measured into a digitizable quantity. The digitizable quantity can be mechanical deformation (e.g. displacement, expansion, deflection, angle turning), dielectric properties (e.g. permittivity (capacitance), permeability (inductance), conductivity (resistance)), electromagnetic wave properties (e.g. amplitude, phase, frequency/wavelength, and polarization), acoustic-wave properties (e.g. wavelength, amplitude, phase, polarization).

For instance, it is understood that a diaphragm is a transducer to convert pressure to be measured into displacement of the diaphragm itself. A liquid-in-glass thermometer is a transducer to convert the temperature into displacement of liquid level. A bimetallic coil is a transducer to convert temperature into angle change of the coil tip. A piezoelectric material is a transducer to convert stress/pressure into resistance or voltage. A fiber-optic interferometer is a transducer to convert pressure/temperature/PH into irradiation amplitude or wavelength shift in spectrum domain.

Figure 7A:
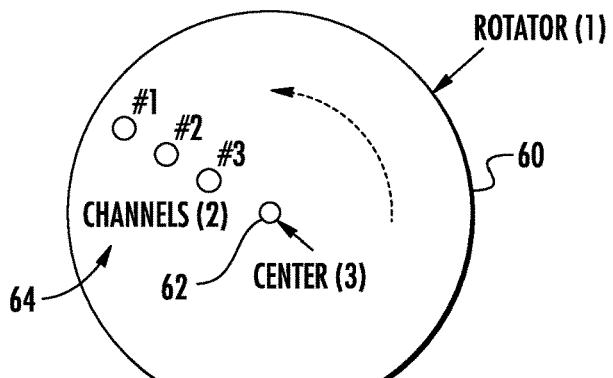
FIGS. 7A, 7B, and 7C depict, respectively, angular turning, displacement, and fluidic deformation models of generation operations of a splitter according to respective example embodiments thereof of the present disclosure.
Figure 7B:
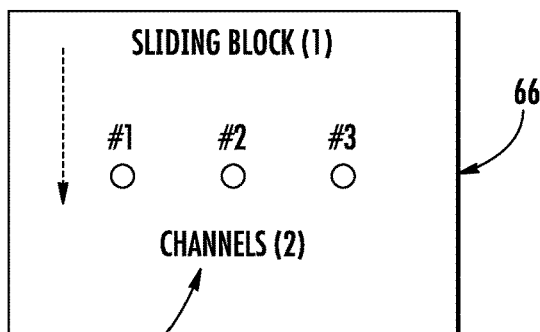
Figure 7C:
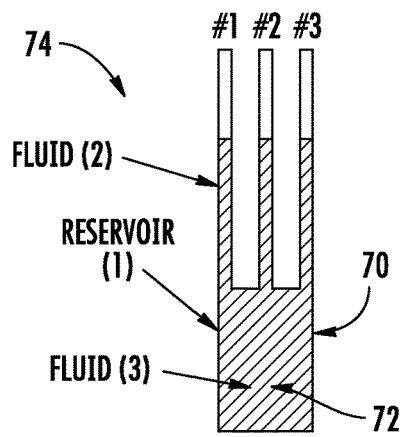

To consider other aspects of implementation examples of presently disclosed subject matter, FIGS. 7A, 7B, and 7C depict, respectively, angular turning, displacement, and fluidic deformation models of generation operations of a splitter (see FIG. 2) according to respective example embodiments thereof of the present disclosure.

Per presently disclosed subject matter, a splitter involves three basic operations: generation (FIG. 7), transformation (FIG. 8), and amplification (FIG. 9). Those basic operations can be cascaded (implemented successively) to construct a whole splitter.

FIGS. 7A-7C show example models of generation operation. In particular, per FIG. 7A, a rotator (a first element) operates with second elements comprising channels and a third element, which is its center. FIG. 7A also represents an angular turning of the rotator generally 60 around its center generally 62. Rotator 60 may, for example, be circular or a rectangular plane or stick. Movement of rotator 60 around its center 62 resulting from transducer input can be distributed to one of multiple channels 64. Channels 64 are placed on rotator 60 either as a single point or as a pattern, performing the same turning angle as the rotator 60.

FIG. 7B represents an embodiment making use of displacement of a first element, a sliding bock 66 resulting from the transducer output, which can be distributed into the channels 68. The channels 68 are placed on sliding block 66 either as a single point or as a pattern, performing the same sliding distance as the sliding block 66.

FIG. 7C represents deformation of a reservoir 70 or/and the expansion of the fluid 72, which can be distributed into tubes 74 with the help of conventional liquid-in-glass structure.

Figure 8A:
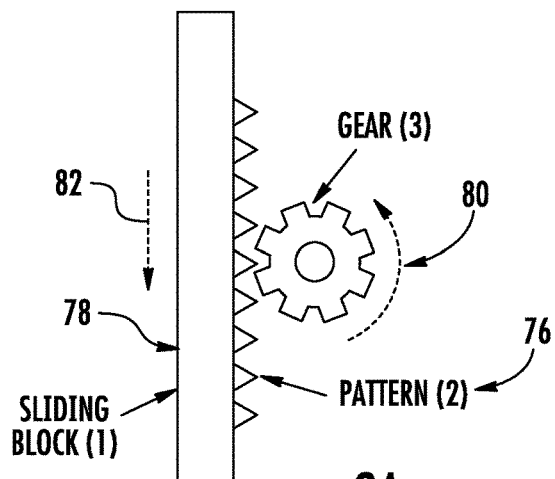
FIGS. 8A, 8B, and 8C depict, respectively, angular turning, displacement, and fluidic deformation models of transformation operations of a splitter according to respective example embodiments thereof of the present disclosure.
Figure 8B:
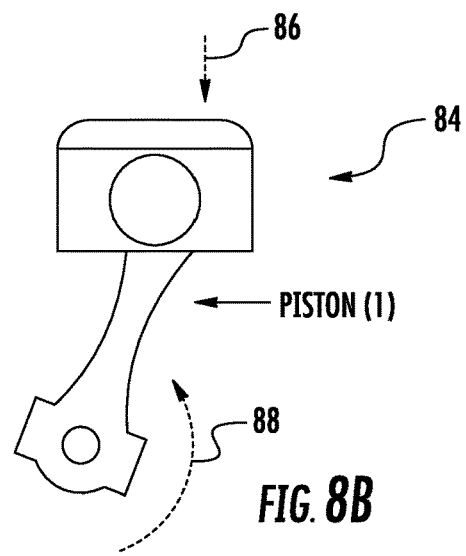
Figure 8C:
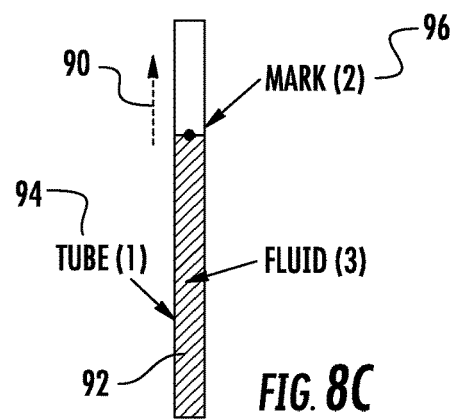

FIGS. 8A, 8B, and 8C depict, respectively, angular turning, displacement, and fluidic deformation models of transformation operations of a splitter according to respective example embodiments thereof of the present disclosure. In particular, such FIG. 8A represents an example model of transformation operation, for transformation between displacement and angular turning. Matched patterns 76 may comprise, for example, bumps or notches on sliding block 78, which will turn gear 80 while block 78 is sliding (82).

FIG. 8B illustrates an exemplary piston 84 used to transform between linear displacement (86) and angular turning (88), while FIG. 8C represents transformation between displacement (90) and fluid deformation. Deformation of fluidic volume 92 in the tube 94 can be transformed into the mark 96 movement related to the fluidic level (e.g. fluid interface, floating object).

Figure 9A:
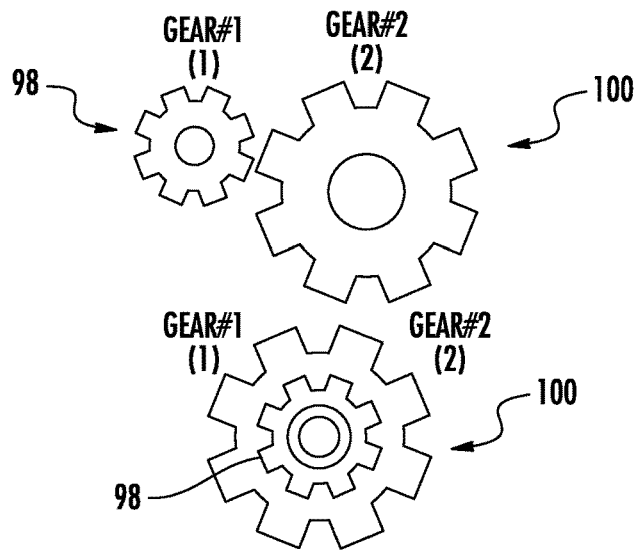
FIGS. 9A, 9B, and 9C depict, respectively, angular turning amplification, displacement amplification, and fluidic deformation amplification models of amplification operations of a splitter according to respective example embodiments thereof of the present disclosure.
Figure 9B:
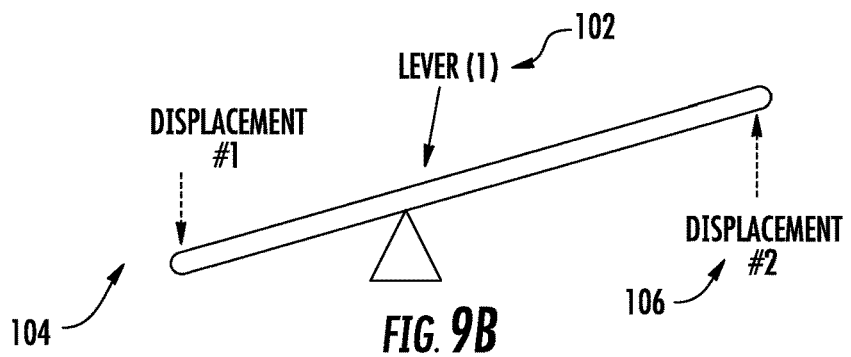
Figure 9C:
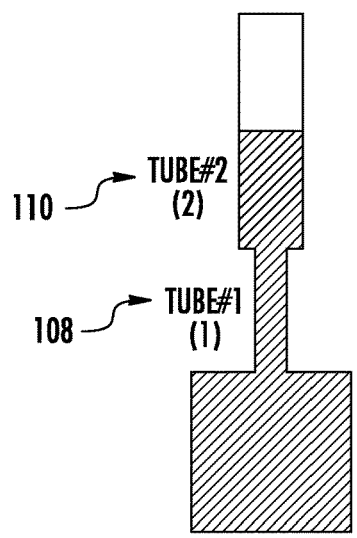

FIGS. 9A, 9B, and 9C depict, respectively, angular turning amplification, displacement amplification, and fluidic deformation amplification models of amplification operations of a splitter according to respective example embodiments thereof of the present disclosure. For example, FIG. 9A represents an example model of amplification operation where displacement amplification can be implemented from a first level using angular turning amplification as implemented by a first gear #1 98 interfaced with a second gear #2 100. Such association can be either external tangential (as shown in the upper illustration) or concentric (as shown in the lower illustration of FIG. 9A.

FIG. 9B shows use of a lever generally 102 for amplified displacement from a first displacement position generally 104 to a second displacement position generally 106, while FIG. 9C represents a fluidic deformation amplification. As will be understood by those of ordinary skill in the art from the illustration of FIG. 9C, such fluidic deformation amplification can be implemented by altering respective inner cross sectional areas of the tubes for respective areas 108 and 110.

Figure 10A:
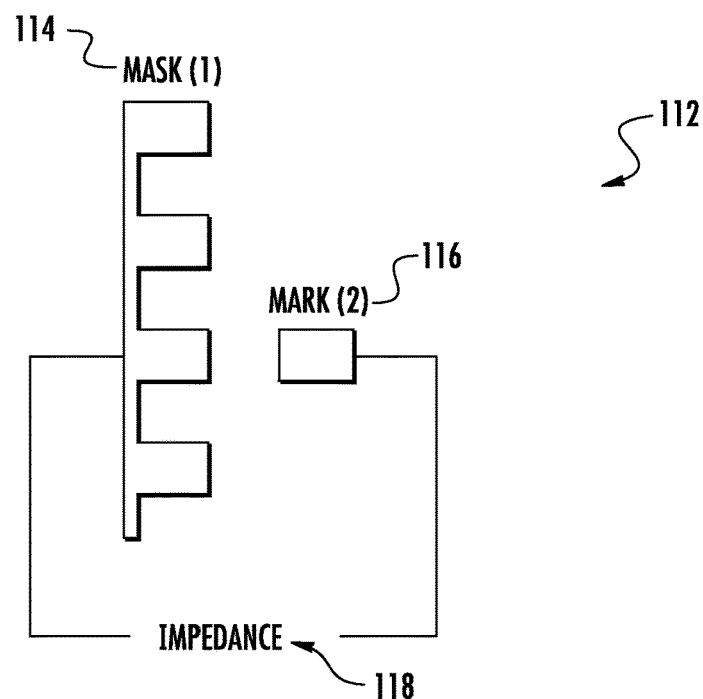
FIGS. 10A and 10B depict example schematic diagrams of an example impedance based encoder according to example embodiments of the present disclosure.

Further consideration of various implementations of presently disclosed subject matter may include consideration of various possible encoder embodiments (see, for example, encoder 14 of FIG. 1 and encoder 26 of FIG. 2). More particularly, for example, FIGS. 10A and 10B depict example schematic diagrams of an example impedance based encoder generally 112 according to example embodiments of the present disclosure.

Per such figures showing an example model of impedance based encoder 112, a first feature comprising a mask 114 (FIG. 10A) has a periodic pattern as shown in a physical dimension such as either mechanical or material. The relative displacement (linear or angular) between a second feature comprising a mark 116 and the mask 114 resulting from each channel output of a splitter could induce periodic impedance alteration 118 between mark 116 and mask 114 as a function of such relative displacement.

Figure 10B:
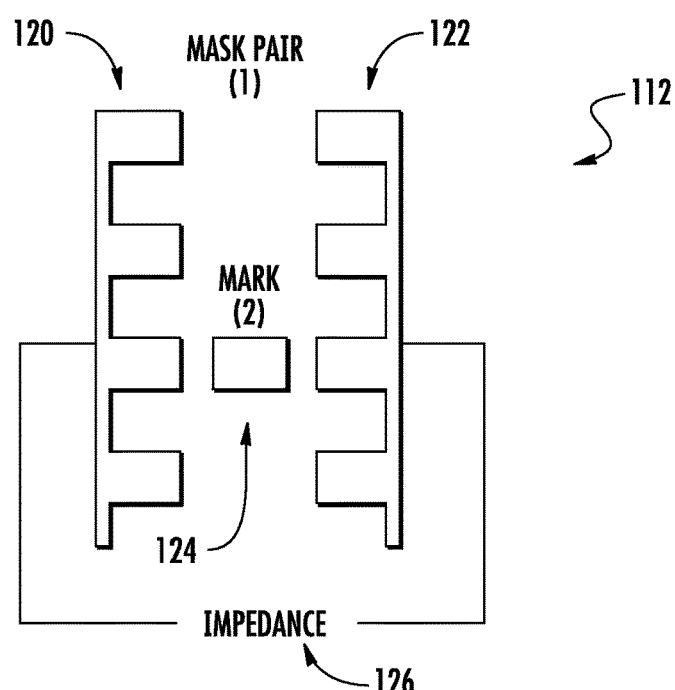

A mask pair (120 and 122) of the exemplary embodiment of FIG. 10B has a periodic pattern as shown in a physical dimension such as mechanical, electrical, optical. The relative displacement (linear or angular) between mark 124 and the mask pair (120, 122) resulting from each channel output of a splitter could induce periodic impedance alteration 126 between the mask pair (1) as a function of the relative displacement.

Figure 11A:
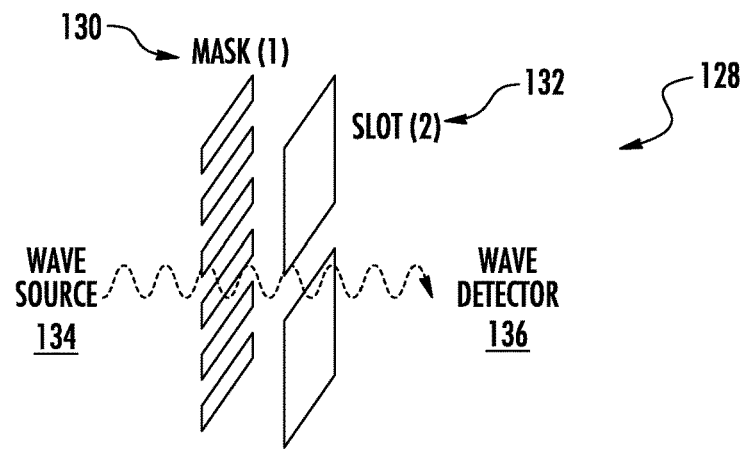
FIGS. 11A, 11B, and 11C depict example schematic diagrams of an example waveguide based encoder according to example embodiments of the present disclosure.
Figure 11B:
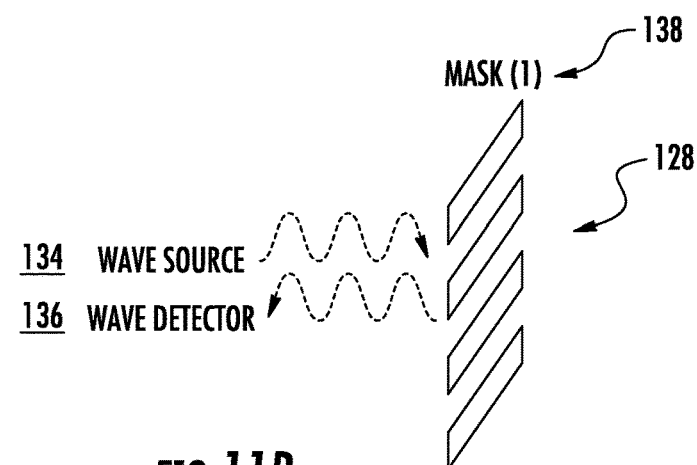
Figure 11C:
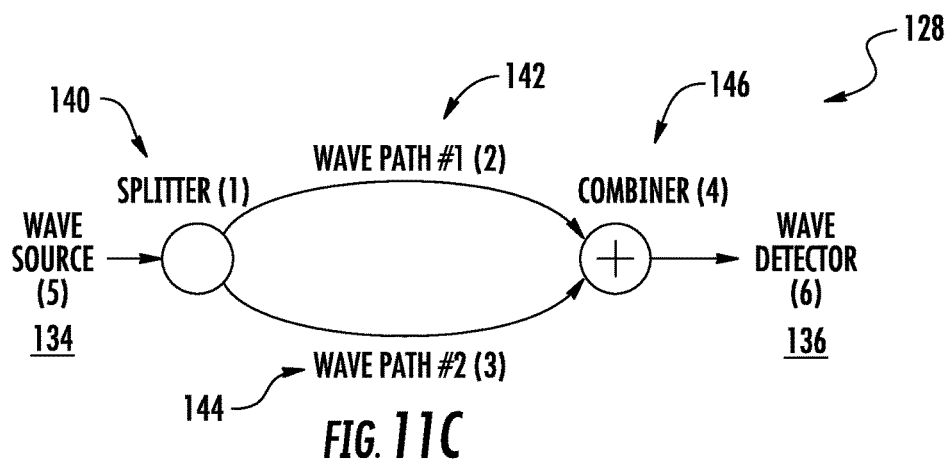

FIGS. 11A, 11B, and 11C depict example schematic diagrams of an example waveguide based encoder according to example embodiments of the present disclosure. Per the example of FIG. 11A, for an example model of waveguide based encoder generally 128, a first element comprising a mask generally 130 has a periodic pattern as shown, in physical dimension (either as mechanical or material). A second element comprising a slot generally 132 is to allow a wave source generally 134 to pass through to a detector generally 136. Such relative displacement (linear or angular) between mark 130 and slot 132 resulting from each channel output of a splitter could induce periodic transmission coefficient alteration between the path from mask 130 to slot 132, or vice versa from slot 132 to mask 130.

Per the example encoder 128 represented by FIG. 11B, relative displacement (linear or angular) of a first component comprising a mask generally 138 resulting from each channel output of a splitter could induce periodic reflection coefficient change at a wave source route (between a wave source generally 134 and a wave detector generally 136.

Per the example encoder 128 represented by FIG. 11C, a first component comprising a splitter generally 140 may generate two partial powers of the wave source generally 134, either by reflection or transmission. Such two-partial powers will travel through a first wave path #1 generally 142 and a second wave path #2 generally 144, respectively and then combine, which is detected by wave detector generally 136. The relative wave length (microwave length, optical length, acoustic) difference change between wave path #1 (142) and wave path #2 (144) resulting from each channel output of a splitter could induce period pattern at the output signal in the combiner generally 146, as a function of the elative wave length difference change. Such structure can be interferometers (e.g. Fabry Perot interferometer, Mach Zehnder interferometer, Michelson interferometer), couplers, or resonators.

Figure 11D:
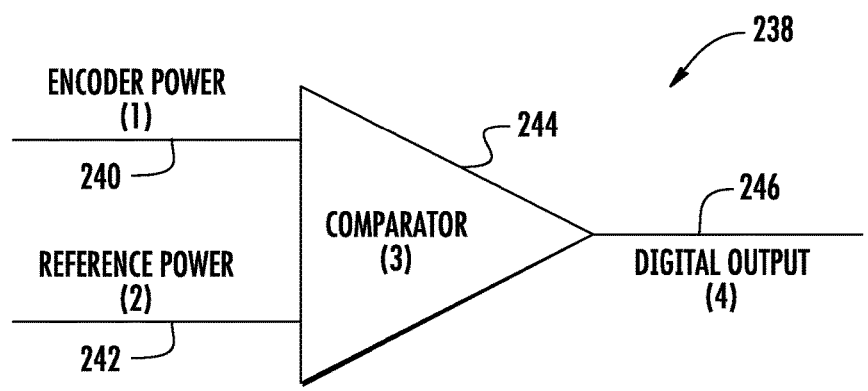
FIG. 11D depicts an example in schematic diagram of an example of a waveguide based logic reader according to example embodiments of the present disclosure.

FIG. 11D depicts an example in schematic diagram of an example of a waveguide based logic reader generally 238 according to example embodiments of the present disclosure.

In particular, FIG. 11D represents four basic components including an input (the encoder power) generally 240, a second input (the reference power) generally 242, a comparator generally 244 for comparing the two inputs 240 and 242, and the resulting digital output generally 246. When the reflection or transmission power 240 from the encoder is directly compared with a reference power 242 through comparator 244, a designated digital output 246 of "1" (or "0") may be used with power 240 is higher than reference power 242. When power 240 is lower than reference power 242, designated digital output 246 may be "0" (or "1").

Figure 11E:
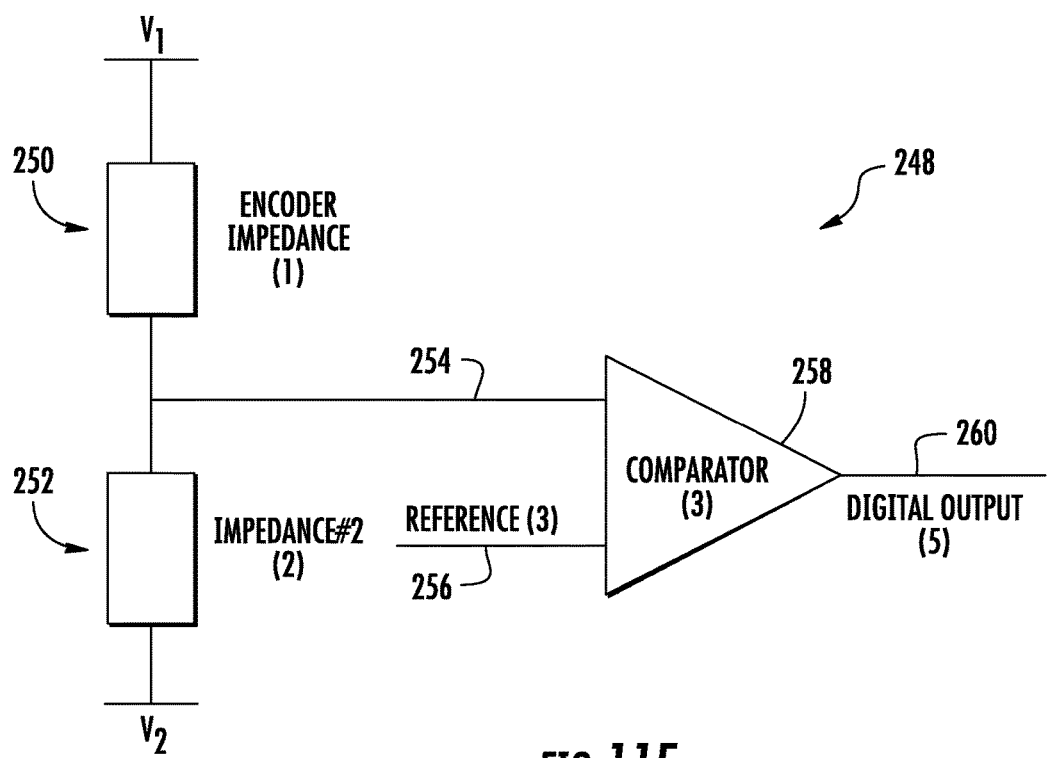
FIG. 11E depicts an example in schematic diagram of an example of an impedance based logic reader according to example embodiments of the present disclosure.

FIG. 11E depicts an example in schematic diagram of an example of an impedance based logic reader generally 248 according to example embodiments of the present disclosure.

In particular, FIG. 11E illustrates an example model of representative logic reader 248, utilizing a voltage divider method input relative to a reference. More specifically, the voltage (AC or DC) difference of V1 and V2 is divided by the encoder first impedance 250 and second impedance 252, and the output voltage 254 is compared with a reference voltage 256 through a comparator 258. When the voltage 254 is higher than reference voltage 256, digital output 260 is designated as "1" (or "0"), and when the voltage 254 is lower than reference voltage 256, digital output 260 is designated as "0" (or "1"). The second impedance 252 can be a constant or a variable, such as the impedance in another channel of the encoder 248.

Figure 12:
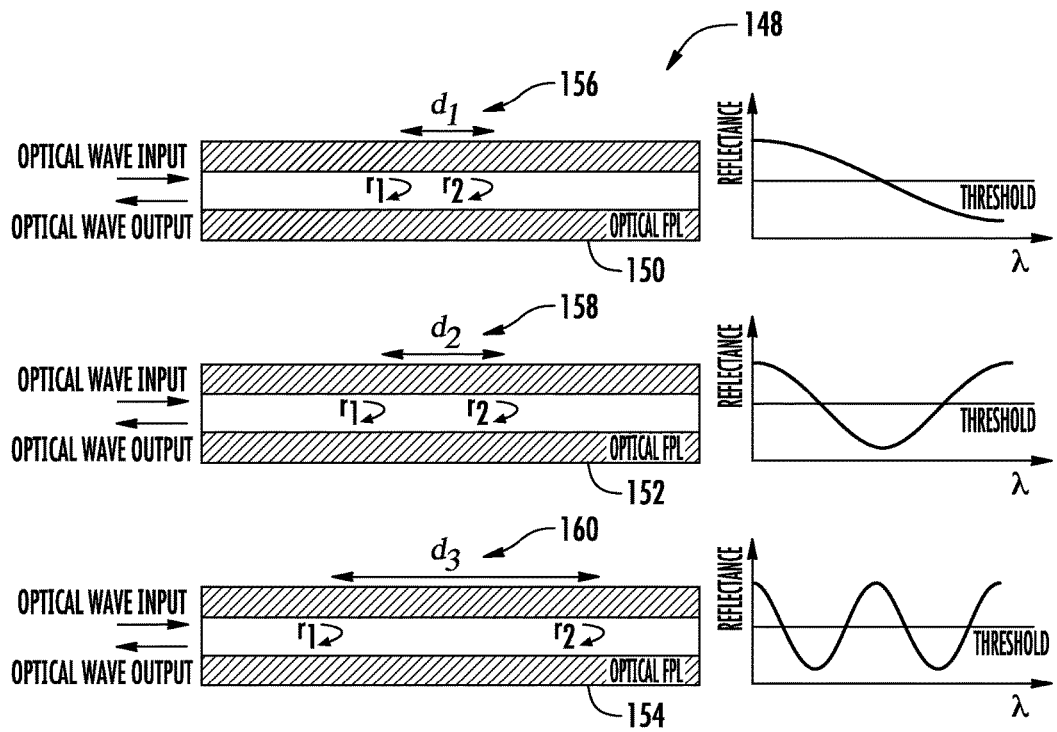
FIG. 12 depicts examples in schematic and graphical diagrams of an example of an optical logic based digitizer for digitization of optical wavelengths according to example embodiments of the present disclosure.

FIG. 12 depicts examples in schematic and graphical diagrams of an example of an optical logic based digitizer for digitization of optical wavelengths according to example embodiments of the present disclosure.

A digitizer/encoder generally in accordance with presently disclosed subject matter is to quantize the output from the transducer into discrete levels and/or encode them into binary/quasi-binary states, whose logics can be identified by an associated reader. Binary states per presently disclosed subject matter have resolutions arranged in the form of 2-times increments. As such, the amount of digitizable quantity can be digitized and encoded according to a $2^N$ format. Therefore, each binary state can be presented in mechanical forms (e.g. "open" or "short" state of contact), electromagnetic forms (e.g. "high" or "low" in electrical and/or magnetic amplitude), and optical or acoustic forms (e.g. "strong" or "weak" in irradiation). Also, each binary state can be presented in step form (rectangular wave) or continuous form (sinusoidal wave).

FIG. 12 represents a fast and low-cost wavelength meter achievable with presently disclosed subject matter, where multi photo-detectors and interferometers are used in substitution for expensive gratings and optics. More particularly, FIG. 12 represents an optical logic based digitizer generally 148 for digitization of optical wavelength in accordance with presently disclosed subject matter. The digitizer generally 148 includes preferably in one embodiment three respective Febry-Perot interferometers 150, 152, and 154 with respective different cavity lengths, as shown. As illustrated, exemplary cavity length $d_1$ is represented by reference number 156, $d_2$ by reference number 158, and $d_3$ by reference number 160. Also as represented in FIG. 12, such respective cavity lengths are arranged in the form of 2-times increments (e.g. $d_3 = 2 \cdot d_2 = 4 \cdot d_1$ in FIG. 12).

In wavelength domain for the FIG. 12 exemplary embodiment, the interference spectra exhibit sinusoidal-wave patterns with their periods arranged in the form of 2-times increments. See the right-hand side wave patterns respectively illustrated in FIG. 12 for each of interferometers 150, 152, and 154. Reflectance at a certain wavelength can be decrypted into a "strong" or "weak" bit in reader back-end by comparison with a threshold reference. As such, the wavelength is represented according to the $2^3$ format and readings simply become 3 states of "strong" or "weak" reflectance.

Figure 13:
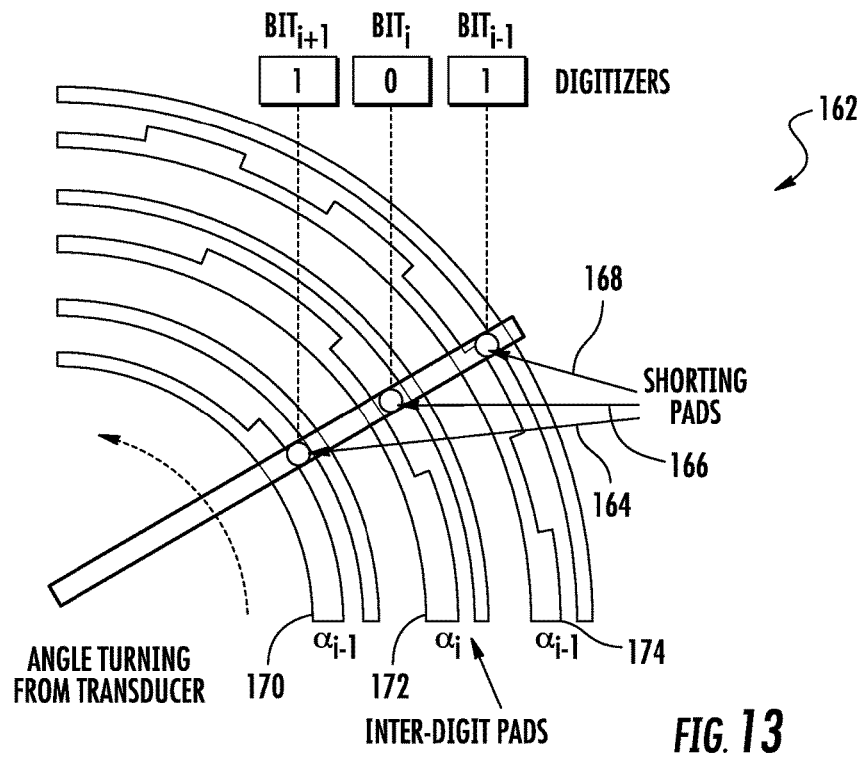
FIG. 13 depicts an example in schematic diagram of an example of a mechanical logic based digitizer for digitization of angle turning changes according to example embodiments of the present disclosure.

FIG. 13 depicts an example in schematic diagram of an example of a mechanical logic based digitizer 162 for digitization of angle turning changes according to example embodiments of the present disclosure.

More particularly, the FIG. 13 mechanical logic based digitizer generally 162 for digitization of angle turning change comprises a 3-bit digitizer. Such 3-bit construction includes three respective pairs of shorting pads (164, 166, and 168) and inter-digit pads (170, 172, and 174). Each shorting pad moves with an associated transducer (not separately illustrated in FIG. 13), acting as a switch slide or a switch knob.

As illustrated, each respective inter-digit pad 170, 172, and 174 includes two isolated electrical conductors, which can be shorted by the corresponding shorting pad 164, 166, or 168 of its respective pair. The mechanical angle turning from an associated transducer results in a relative angle movement between the inter-digit pads and the shorting pads. When the shorting pad switches to some certain positions, it would short the inter-digit pads. When the angular turning is tracked over the whole range, the state of the inter-digit pad switches between "short" and "open", following a rectangular-wave pattern.

Such three pairs are designed with their equivalent sensing resolution arranged in a form of 2-times increments (e.g. $\alpha_i = 2\alpha_{i-1}$ in FIG. 13). As such, the amount of mechanical change is represented with respect to $2^3$ format, and readings simply become 3 states of "short" or "open" ("1" or "0"), which one-to-one map to the mechanical angle change. Note that the FIG. 13 illustration represents merely one example where a resulting reading indicates a designation of "1", "0", "1", reflecting whether the illustration indicates shorting ("1") or non-shorting ("0") at given paired pad positions.

For exemplary embodiments of the presently disclosed subject matter involving a reader (see, for example, component 16 of FIG. 1 and component 28 of FIG. 2), the reader functionality is to read out the binary logics from a digitizer/encoder and decrypt/acquire the binary codes. A reference is used to decrypt/encode into binary bits ("1" or "0"). Voltage amplitude (DC or AC) is usually used as the reference in electronics; irradiation is usually used as the reference in optics. For instance, the "open" or "short" contact state in FIG. 13 can be encoded by DC voltage with pull-up input port. "High" or "low" amplitude can be identified by comparison with a reference voltage. "Strong" or "weak" irradiation in FIG. 12 can likewise be identified with a reference.

The binary code can be various, depending on working principle and application. For example, in some embodiments, in order to avoid transition error for two successive values, gray code may be used. For example, in FIG. 12, cosine waves may be transformed into inverted gray code by a reader.

Additional implementation aspects of certain embodiments of the presently disclosed subject matter relate to a transmitter feature (where incorporated). See, for example, component 18 of FIG. 1. In general, the function of such a transmitter is to send out binary bits to distant (or at least non-integrated) digital devices and processors. The transmission media can be wire (e.g. cable, twisted pair, Ethernet) or wireless (e.g. WiFi, Bluetooth, ZigBee). The transmission protocol can be various (e.g. TCP/IP, UART, USB, IEEE 802.15.x, NFC).

Figure 14A:
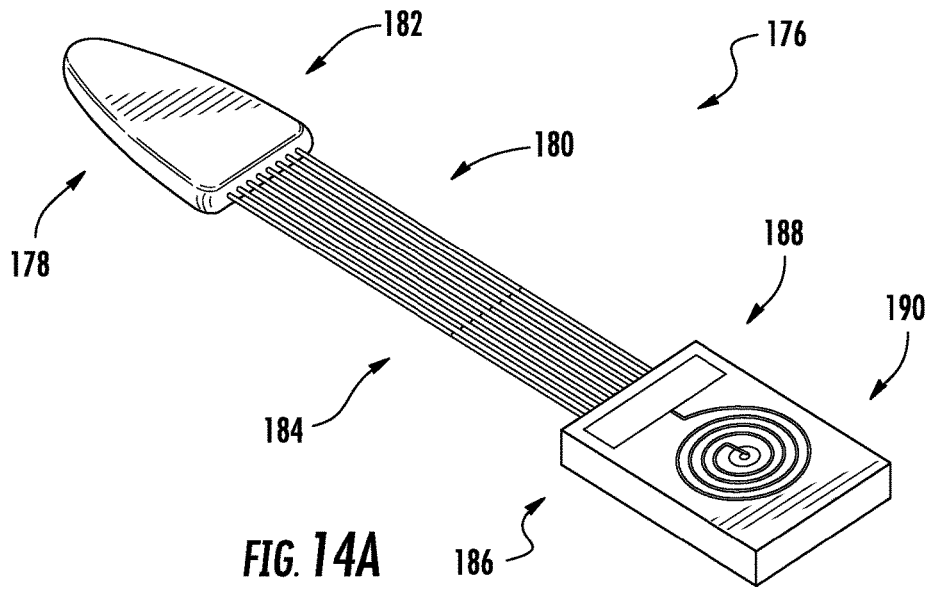
FIGS. 14A and 14B depict an example of a digitizer for a high temperature digital thermometer application according to example embodiments of the present disclosure.
Figure 14B:
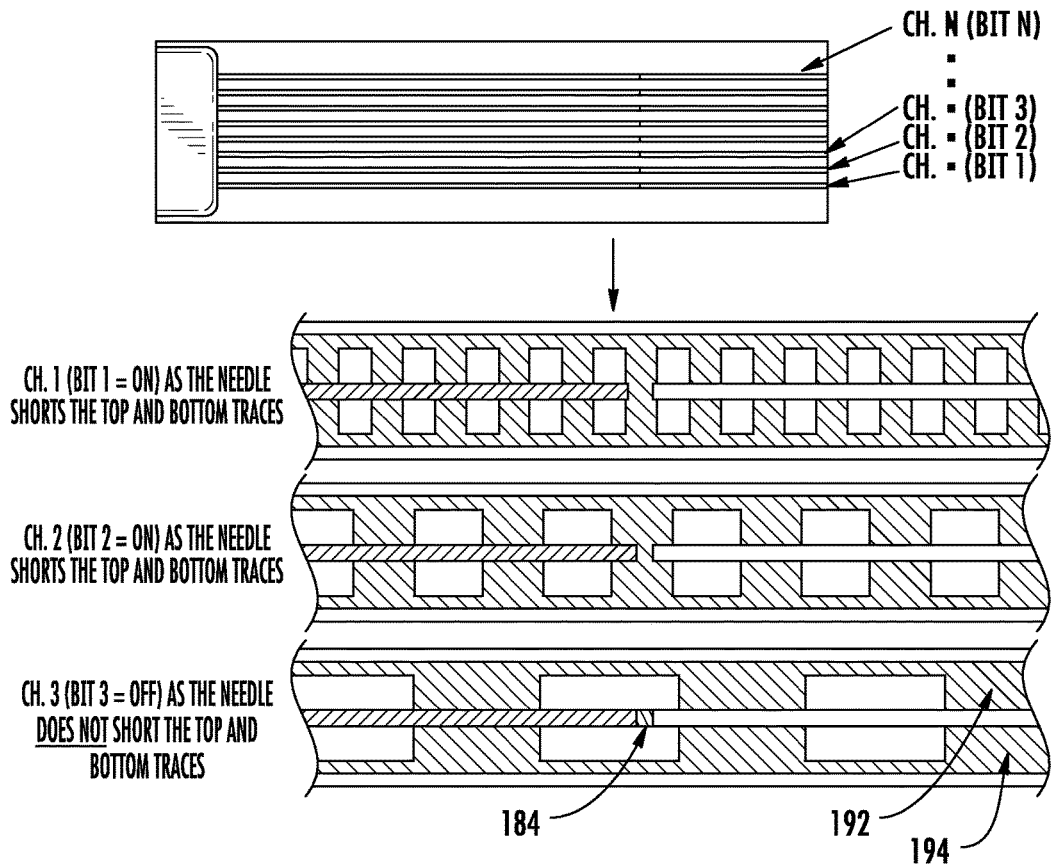

FIGS. 14A and 14B depict an example of a digitizer for a high temperature digital thermometer application according to example embodiments of the present disclosure. In particular, FIG. 14A represents an illustration in partial see-through of a perspective view of a high temperature digital thermometer in a substrate generally 178 (such as of sapphire), making use of a liquid-in-Mass digitizer generally 176 for a temperature/pressure sensing application. Generally speaking, N identical capillary tubes or channels 180 are joined into a reservoir generally 182, constructing a liquid-in-glass structure, with multiple liquid columns. When reservoir 182 is under applied temperature or applied pressure, it would pump the liquid into the capillary tubes, with the same amount in each channel. The pump force would push the conductive needles generally 184 (liquid metal needles suspended at the top of the liquid columns) in the capillary with the same distance in each channel, as well.

FIG. 14A also represents optional inclusion of an expansion chamber feature generally 186, passive resonator circuitry generally 188, and an antenna generally 190.

FIG. 14B illustrates a top plan view of a portion of the FIG. 14A subject matter, and with a greatly enlarged portion shown for three exemplary bits/channels, as illustrated. The top and bottom electrode pairs 192 and 194 in the channels 180, with the spacing arranged in the form of 2-times increments (e.g. $L_3 = 2 \cdot L_2 = 4 \cdot L_1$), would cooperate with the conductive needle 184 and perform "short" and "open" states periodically. As such, the binary combination of the "open/short" states denotes the liquid column as a function of either pressure or temperature. Per the three exemplary bits shown in the enlarged portion of FIG. 14B, the results are short ("1"), short ("1") and not short ("0").

Figure 15:
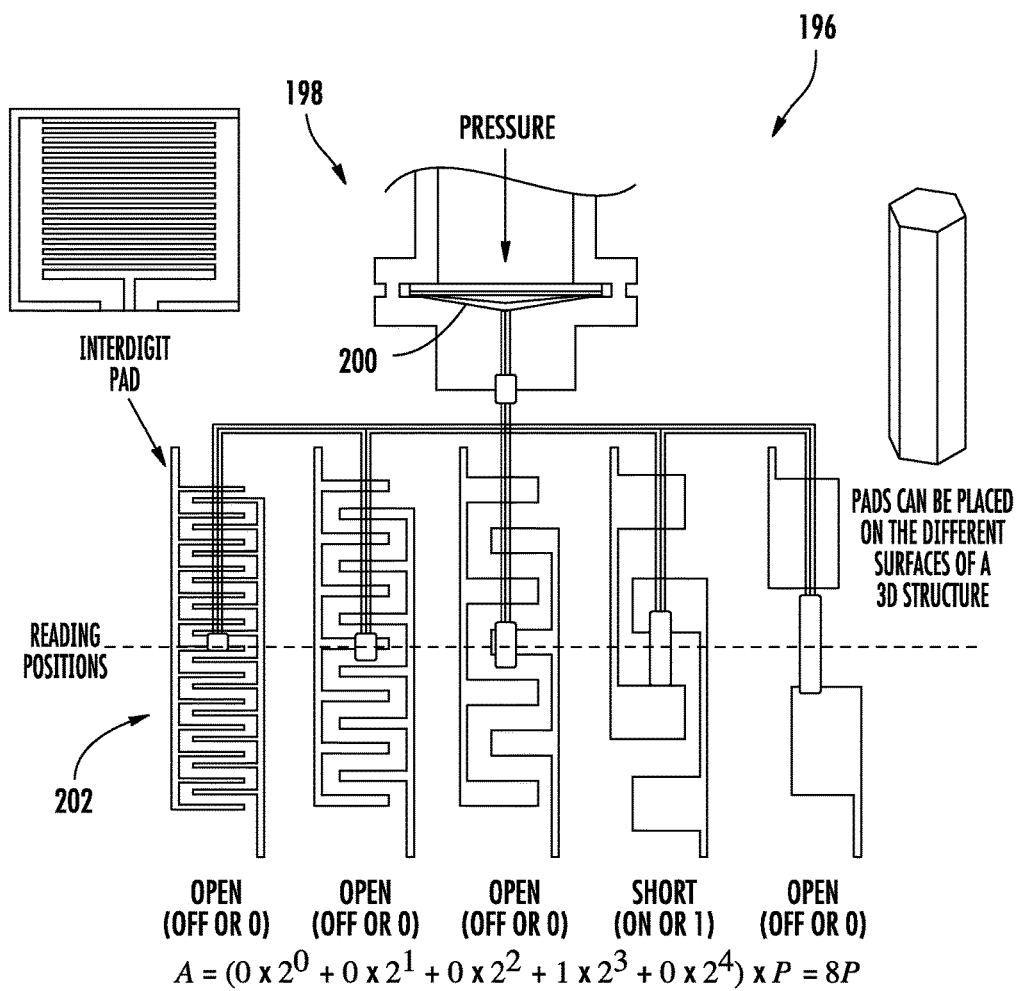
FIG. 15 depicts an example in schematic diagram of an example of a diaphragm based digitizer for pressure sensing according to example embodiments of the present disclosure.

FIG. 15 depicts an example in schematic diagram of an example of a diaphragm based digitizer generally 196 for pressure sensing according to example embodiments of the present disclosure.

As generally represented in the upper right-hand corner of FIG. 15, pads per the FIG. 15 embodiment can be placed or supported on different surfaces of a three-dimensional structure, to accommodate implementation in a variety of embodiments. For all such embodiments, a digitizer generally 196 makes use of a diaphragm based pressure sensor generally 198. When the diaphragm 200 is under applied pressure, the deformation of the diaphragm would push the associated N digitizers with a small amount of displacement. Such vertical displacement in the embodiment illustrated would be digitized by the N digitizers, with the spacing of the interdigit pads generally 202 arranged in the form of 2-times increments.

Using an "open" or "short" protocol for the represented implementation of FIG. 15 reflects an exemplary position resulting in a digitized signal of 8 P. The illustrated embodiment uses a 5-bit arrangement. In other words, determinations are made at five different positions, where the spacing is arranged in the herein-referenced 2-times increments. In the illustrated example, a single bit is "short" (indicating a "1") in a $2^3$ position, which represents the indicated 8 P result.

Figure 16:
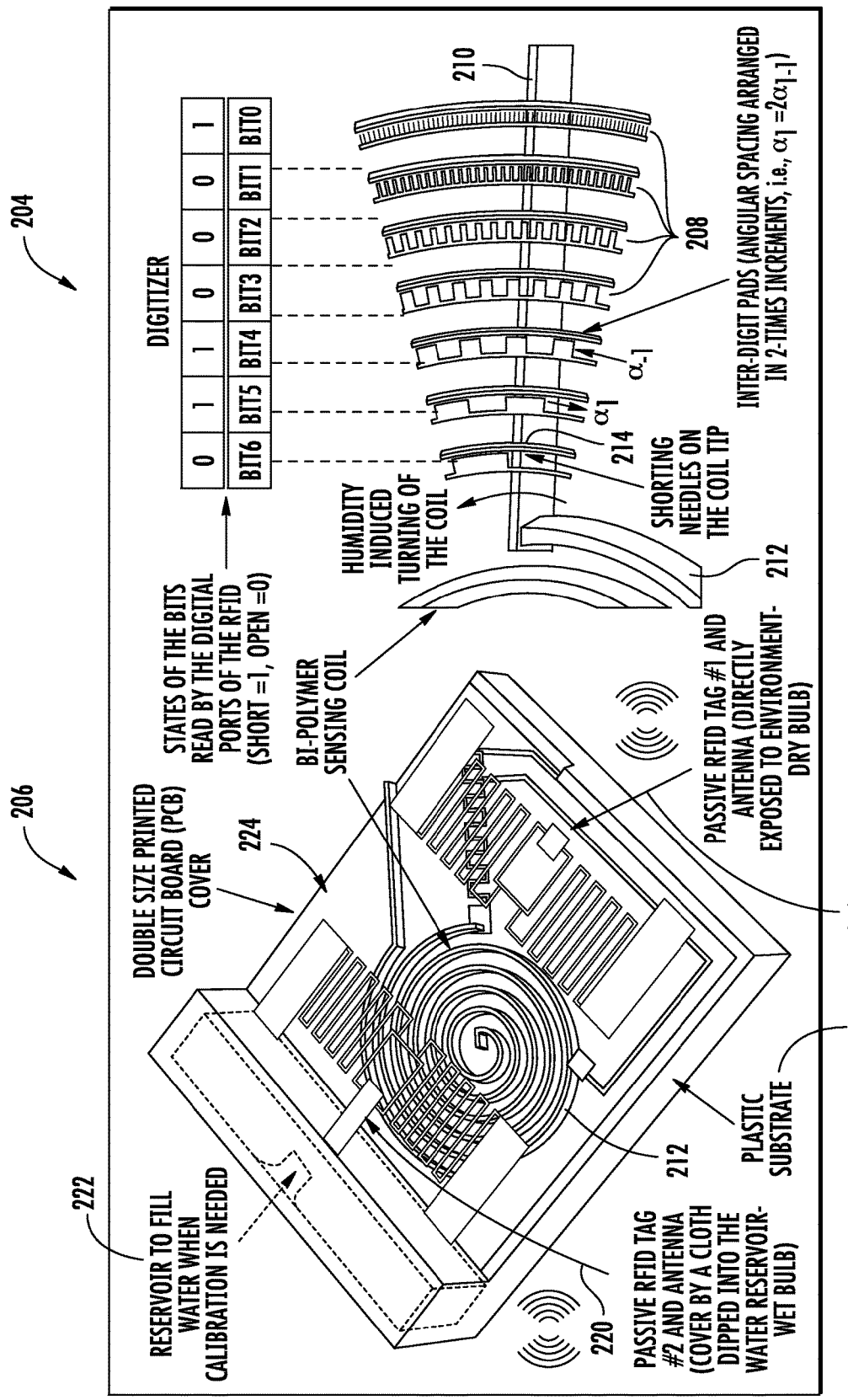
FIG. 16 depicts an example in schematic diagram of an example of a digitizer for an RFID humidity sensor application according to example embodiments of the present disclosure.

FIG. 16 depicts an example in schematic diagram of an example of a digitizer generally 204 for an MD humidity sensor application generally 206 according to example embodiments of the present disclosure. More particularly, the right-hand side of the illustration of FIG. 16 represents use of a sensing coil as a transducer to convert a measured parameter (humidity) into an angle change of the coil tip. As shown, a seven bit arrangement makes use of respective inter-digit pads or structures generally 208, similar to the embodiment of FIG. 15 but in a curved arrangement to interface with angular displacement of an extended tip generally 210 of a bi-polymer sensing coil generally 212 for responding to humidity changes to which the sensor 206 is exposed. As understood from the discussion herewith of other presently disclosed embodiments, a plurality of shorting needles generally 214 mounted on tip 210 respectively interface with portions of the pads 208, to be either shorted or open, depending on their respective paired positions for each channel/bit of the digitizer 204.

As further shown, sensor 206 may include a plastic substrate generally 216 for supporting and housing coil 212 along with respective first second passive RFID tags 218 and 220, which are respectively exposed to either of dry or wet environments. A reservoir generally 222 may be provided for being filled with water whenever calibration is needed. Printed circuit board features may be included in a cover 224 of substrate 216, as illustrated.

FIGS. 17A, 17B, and 17C depict an example of an all-digital passive RFID sensor generally 226 for a 4-bit wireless temperature sensor application according to example embodiments of the present disclosure.

More particularly, FIG. 17A illustrates an example of an all-digital passive RFID sensor generally 226 for a 4-bit wireless temperature sensor application using a bimetallic coil as a transducer to convert temperature into angle change of the coil tip. FIG. 17A further shows shorts of sensor results, as obtained from RFID sensor 226, using a standard RFID reader generally 228 and reader antenna generally 230.

FIG. 17B illustrates an enlarged image of the RED sensor 206 of FIG. 17A, showing an angular coil tip and digitizing arrangement similar to that of the embodiment of FIG. 16 herewith, using a bimetallic coil generally 232, having a tip 234, and set of digitizing pads 236 which interface with such tip 234. FIG. 17C shows an enlarged image of a side of sensor 226 reverse to that as seen in FIG. 17B, and illustrating the RFID tags used in such embodiment. Four RFID tags detect 4 bits respectively, which can be transmitted to digital system for further processing.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. Apparatus for direct digitization and encoding of a parameter to be sensed or measured, comprising:
   an encoder for producing encoded binary states based on a digitizable quantity from a transducer associated with a parameter to be sensed or measured; and
   a digitizing reader for producing binary bits from said encoded binary states from said encoder;
   wherein said apparatus further includes a transmitter for receiving said binary bits and transmitting them to external digital devices for processing;
   said encoder is a passive device; and
   said transmitter is one of a wired and wireless device.

2. Apparatus as in claim 1, wherein said encoder includes a plurality of channels for producing binary states having resolutions arranged according to a $2^N$ format.

3. Apparatus as in claim 1, wherein said binary states comprise one of mechanical, electromagnetic, optical, acoustical, step, and continuous forms.

4. Apparatus as in claim 1, wherein said apparatus further includes a transducer for converting a parameter to be measured into an analog digitizable quantity.

5. Apparatus as in claim 4, wherein said transducer conversion is based on one of mechanical deformation, dielectric properties, permeability properties, conductivity properties, electromagnetic wave properties, and acoustic-wave properties.

6. Apparatus as in claim 5, wherein said transducer comprises a piezoelectric material transducer for converting stress/pressure into electrical resistance or voltage.

7. Apparatus as in claim 5, wherein said transducer comprises a fiber-optic interferometer transducer for converting pressure/temperature/PH into one of irradiation amplitude or wavelength shift in the spectrum domain.

8. Apparatus for direct digitization and encoding of a parameter to be sensed or measured, comprising:
   an encoder for producing encoded binary states based on a digitizable quantity from a transducer associated with a parameter to be sensed or measured; and
   a digitizing reader for producing binary bits from said encoded binary states from said; wherein
   said encoder produces N-channel periodic quantities; and
   said digitizing reader converts said N-channel periodic quantities from said encoder into an N-bit binary combination.

9. Apparatus as in claim 8, wherein said reader, for each channel of said N-channel periodic quantities, uses a reference threshold for comparison, to convert encoder quantities for each channel to one of two binary states based on whether the quantity is above or below the reference threshold.

10. Apparatus as in claim 9, wherein said N-bit binary combination comprises one of natural binary code, folded binary code, 1's complement coding, 2's complement coding, and gray code.

11. A system for all-digital direct sensing, digitizing, and encoding of a parameter to be measured, comprising:
    a transducer for converting a parameter to be measured into an analog digitizable quantity output;
    a passive digitizer and encoder for quantizing said transducer output and encoding said output into binary states having a $2^N$ format; and
    a reader for decrypting said formatted binary states into N-bit binary combinations with one-to-one mapping to the parameter to be measured.

12. A system as in claim 11, further comprising a transmitter for forwarding said N-bit binary combinations from said reader to other digital devices for processing thereof.

13. A system as in claim 11, wherein said passive digitizer and encoder includes a periodic pattern and a plurality of markers relatively displaced from each other by said transducer output.

14. A system as in claim 13, wherein:
    said binary states include N-channel periodic quantities; and said reader, for each channel of said N-channel periodic quantities, uses a reference threshold for comparison, to convert encoder quantities for each channel to one of two binary states based on whether the quantity is above or below the reference threshold.

15. A system as in claim 11, wherein said transducer output is based on one of mechanical deformation, dielectric properties, permeability properties, conductivity properties, electromagnetic wave properties, and acoustic-wave properties.

16. A system as in claim 11, wherein said binary states comprise one of mechanical, electromagnetic, optical, acoustical, step, and continuous forms.

17. A system as in claim 11, wherein said N-bit binary combinations comprise one of natural binary code, folded binary code, 1's complement coding, 2's complement coding, and gray code.

18. A system as in claim 11, wherein said passive digitizer and encoder are one of impedance-based, displacement-based, waveguide-based, and optical logic-based.

19. A system as in claim 11, wherein:
said passive digitizer and encoder comprise a liquid-in-glass digitizer; and
said system comprises a high temperature digital thermometer application.

20. A system as in claim 11, wherein said passive digitizer and encoder comprise a diaphragm-based digitizer for pressure sensing.

21. A system as in claim 11, wherein:
said transducer comprises a bimetallic coil having a coil tip, to convert temperature into angle change of said coil tip;
said passive digitizer and encoder comprise a set of arcuate N-channel inter-digit pads directly associated with movement changes of said coil tip, for creating a corresponding N plurality of shorted or open binary states relative to said coil tip;
said reader decrypts said plurality of shorted or open binary states into said N-bit binary combinations with one-to-one mapping to the parameter to be measured;
said parameter to be measured is ambient temperature at said bimetallic coil; and
said system further includes at least one RFID chip for forwarding of said N-bit binary combinations.

22. Methodology for direct digitization and encoding of a parameter to be sensed or measured, comprising:
encoding directly into encoded binary states a digitizable quantity from a transducer associated with a parameter to be sensed or measured;
producing binary bits from said encoded binary states; and
transmitting said binary bits to external digital devices for processing;
wherein said encoding uses a passive device, not requiring external power; and
said transmitting is either wired or wireless transmission.

23. Methodology as in claim 22, wherein said encoding includes producing encoded binary states for a plurality of channels having resolutions arranged according to a $2^N$ format.

24. Methodology as in claim 22, wherein said encoded binary states comprise one of mechanical, electromagnetic, optical, acoustical, step, and continuous forms.

25. Methodology as in claim 22, further including converting a parameter to be measured into an analog digitizable quantity.

26. Methodology as in claim 25, wherein said converting is based on one of mechanical deformation, dielectric properties, permeability properties, conductivity properties, electromagnetic wave properties, and acoustic-wave properties.

27. Methodology as in claim 26, wherein said converting includes providing a piezoelectric material transducer for converting stress/pressure into electrical resistance or voltage.

28. Methodology as in claim 26, wherein said converting includes providing a fiber-optic interferometer transducer for converting pressure/temperature/PH into one of irradiation amplitude or wavelength shift in the spectrum domain.

29. Methodology as in claim 22, wherein said parameter to be sensed or measured comprises temperature, strain, refractive index, pressure, vibration, distance, velocity, acceleration, current, or voltage, or intensity or frequency or wavelength of acoustic wave, electromagnetic wave, or optical wave spectra.

30. Methodology for direct digitization and encoding of a parameter to be sensed or measured, comprising:
encoding directly into encoded binary states a digitizable quantity from a transducer associated with a parameter to be sensed or measured; and
producing binary bits from said encoded binary states;
wherein said encoding includes producing N-channel periodic quantities; and
said producing binary bits includes converting said N-channel periodic quantities into an N-bit binary combination.

31. Methodology as in claim 29, wherein said N-channel periodic quantities are based on variations in properties of impedance, permittivity, capacitance, permeability, inductance, conductivity, or resistance, or variations in waveguide properties for electromagnetic, optical, or acoustic spectra, including properties of reflection coefficient and transmission coefficient.

32. Methodology as in claim 29, wherein said converting said N-channel periodic quantities includes, for each channel of said N-channel periodic quantities, using a reference threshold for comparison, to convert encoded quantities for each channel to one of two binary states based on whether the quantity is above or below the reference threshold.

33. Methodology as in claim 32, wherein said N-bit binary combination is formed using one of natural binary code, folded binary code, 1's complement coding, 2's complement coding, and gray code.

34. Methodology as in claim 30, wherein said parameter to be sensed or measured comprises temperature, strain, refractive index, pressure, vibration, distance, velocity, acceleration, current, or voltage, or intensity or frequency or wavelength of acoustic wave, electromagnetic wave, or optical wave spectra.

* * * * *